United States Patent
Ke et al.

(10) Patent No.: US 11,523,501 B2
(45) Date of Patent: Dec. 6, 2022

(54) STRETCHABLE ELECTRONIC DEVICE

(71) Applicant: Au Optronics Corporation, Hsinchu (TW)

(72) Inventors: Tsung-Ying Ke, Hsinchu (TW);
Chun-Nan Chen, Hsinchu (TW);
Zih-Shuo Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/170,773

(22) Filed: Feb. 8, 2021

(65) Prior Publication Data
US 2022/0061153 A1 Feb. 24, 2022

(30) Foreign Application Priority Data
Aug. 20, 2020 (TW) .................. 109128440

(51) Int. Cl.
*H05K 1/02* (2006.01)
*H05K 1/03* (2006.01)
*H05K 1/09* (2006.01)
*H05K 1/18* (2006.01)
*H05K 1/11* (2006.01)

(52) U.S. Cl.
CPC .......... *H05K 1/0283* (2013.01); *H05K 1/028* (2013.01); *H05K 1/0393* (2013.01); *H05K 1/181* (2013.01); *H05K 1/09* (2013.01); *H05K 1/095* (2013.01); *H05K 1/111* (2013.01); *H05K 2201/0314* (2013.01); *H05K 2201/0338* (2013.01); *H05K 2201/09263* (2013.01); *H05K 2201/10106* (2013.01)

(58) Field of Classification Search
CPC .... H05K 1/0283; H05K 1/028; H05K 1/0393; G09F 9/301
See application file for complete search history.

(56) References Cited

U.S. PATENT DOCUMENTS

| | | | |
|---|---|---|---|
| 8,513,532 B2 * | 8/2013 | Chen | H01L 23/4985 174/254 |
| 9,832,863 B2 * | 11/2017 | Elsherbini | H05K 3/301 |
| 10,135,011 B2 | 11/2018 | Park et al. | |
| 10,285,263 B2 | 5/2019 | Hong et al. | |
| 10,826,002 B2 | 11/2020 | Park et al. | |
| 2016/0066411 A1 | 3/2016 | Hong et al. | |
| 2017/0231082 A1 * | 8/2017 | Yoshida | H05K 1/0283 |

(Continued)

FOREIGN PATENT DOCUMENTS

| | | |
|---|---|---|
| CN | 105430866 | 3/2016 |
| CN | 107221550 | 9/2017 |

(Continued)

*Primary Examiner* — Ishwarbhai B Patel
(74) *Attorney, Agent, or Firm* — JCIPRNET (57) ABSTRACT

A stretchable electronic device includes a substrate, a plurality of electronic elements, and a conductive wiring. The electronic elements and the conductive wiring are disposed on the substrate, and the conductive wiring is electrically connected to the electronic elements. The conductive wiring is formed by stacking an elastic conductive layer and a non-elastic conductive layer. A fracture strain of the elastic conductive layer is greater than a fracture strain of the non-elastic conductive layer, and the non-elastic conductive layer includes a plurality of first fragments which are separated from one another.

12 Claims, 8 Drawing Sheets

(56) References Cited

U.S. PATENT DOCUMENTS

2017/0279057 A1   9/2017 Park et al.
2018/0192520 A1* 7/2018 Choong .................. H01L 21/56
2019/0088894 A1   3/2019 Park et al.

FOREIGN PATENT DOCUMENTS

| CN | 107768343 | 3/2018 |
| CN | 109378332 | 2/2019 |
| CN | 109860246 | 6/2019 |
| CN | 110072328 | 7/2019 |

* cited by examiner

FIG. 8C    FIG. 8D

STRETCHABLE ELECTRONIC DEVICE

CROSS-REFERENCE TO RELATED APPLICATION

This application claims the priority of Taiwan patent application serial no. 109128440, filed on Aug. 20, 2020. The entirety of the above-mentioned patent application is hereby incorporated by reference and made a part of this specification.

BACKGROUND

Technical Field

The disclosure relates to an electronic device, and particularly relates to a stretchable electronic device.

Description of Related Art

With the advancement of display technologies, the development of stretchable displays tends to become more and more active, so as to perform a display function on stretchable materials. However, conductive wires inside the stretchable displays are easily broken due to excessive extension.

SUMMARY

The disclosure provides a stretchable electronic device, which can mitigate an issue of easily broken conductive wires due to excessive extension.

According to an embodiment of the disclosure, a stretchable electronic device includes a substrate, a plurality of electronic elements, and a conductive wiring. The electronic elements and the conductive wiring are disposed on the substrate, and the conductive wiring is electrically connected to the electronic elements. The conductive wiring is formed by stacking an elastic conductive layer and a non-elastic conductive layer. A fracture strain of the elastic conductive layer is greater than a fracture strain of the non-elastic conductive layer, and the non-elastic conductive layer includes a plurality of first fragments that are separated from one another. The elastic conductive layer is a continuous wiring. An orthogonal projection of the elastic conductive layer one the substrate overlaps orthogonal projections of a plurality of the first fragments and a plurality of gaps among the plurality of the first fragments on the substrate.

In an embodiment of the disclosure, the elastic conductive layer is located between the substrate and the non-elastic conductive layer.

In an embodiment of the disclosure, the non-elastic conductive layer is located between the substrate and the elastic conductive layer.

In an embodiment of the disclosure, both the non-elastic conductive layer and the elastic conductive layer are in contact with the substrate, and the elastic conductive layer covers the non-elastic conductive layer.

In an embodiment of the disclosure, the non-elastic conductive layer is in contact with the substrate, and the elastic conductive layer covers the non-elastic conductive layer.

According to an embodiment of the disclosure, another stretchable electronic device includes a substrate, a plurality of electronic elements, and a conductive wiring. The electronic elements and the conductive wiring are disposed on the substrate, and the conductive wiring is electrically connected to the electronic elements. The conductive wiring is formed by stacking an elastic conductive layer, a first non-elastic conductive layer, and a second non-elastic conductive layer. A fracture strain of the elastic conductive layer is greater than a fracture strain of the first and second non-elastic conductive layers, and the non-elastic conductive layers include a plurality of first fragments which are separated from one another. The elastic conductive layer is located between the first non-elastic conductive layer and the second non-elastic conductive layer.

In an embodiment of the disclosure, the fracture strain of the elastic conductive layer is greater than 10%.

In an embodiment of the disclosure, the fracture strain of the first and second non-elastic conductive layers is less than 10%.

In an embodiment of disclosure, a material of the elastic conductive layer is at least one of polyacetylene, polypyrrole, polythiophene, polyaniline, poly(p-phenylene), and poly(p-phenylene vinylene).

In an embodiment of the disclosure, when the substrate is not stretched, the first fragments are in contact.

In an embodiment of the disclosure, when the substrate is not stretched, the first fragments are separated from one another.

In an embodiment of the disclosure, a Young's modulus of the substrate is less than 10 GPa.

In an embodiment of the disclosure, the electronic elements are a plurality of display elements.

In light of the foregoing, in the stretchable electronic device provided in one or more embodiments of the disclosure, the conductive wiring formed by the stacking the elastic conductive layer and the non-elastic conductive layer is not easily broken during extension and contraction and has favorable conductivity.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Various embodiments of the disclosure are disclosed in the drawings, and for the sake of clarity, many of the practical details are set forth in the following description. However, it should be understood that these practical details should not be used to limit the disclosure. In other words, these practical details are not necessary in certain embodiments of the disclosure. In addition, to simplify the drawings, some conventional structures and elements in the drawings will be shown in a simple and schematic manner.

Throughout the specification, the same reference numerals in the accompanying drawings denote the same or similar elements. In the accompanying drawings, thicknesses of layers, films, panels, regions and so on are exaggerated for clarity. It should be understood that when an element such as a layer, film, region, or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

It should be understood that, although the terms "first", "second", etc., may be used herein to describe various elements, components, regions, layers and/or sections, these elements, components, regions, layers, and/or sections should not be limited by these terms. These terms are used to distinguish one element, component, region, layer or section from another element, component, region, layer or section.

The terminology used herein is for the purpose of describing particular embodiments and is not intended to be limiting of the disclosure. As used herein, the singular forms "a", "an" and "the" are intended to include the plural forms as well, unless the context clearly indicates otherwise. Herein, "or" represents "and/or". The term "and/or" used herein includes any or a combination of one or more of the associated listed items. It will be further understood that the terms "comprise", "comprising", "include" and/or "comprising", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the drawings is flipped, an element described as being disposed "below" other elements shall be re-orientated to be "above" other elements. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

The term "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "approximately" may mean within one or more standard deviations, or within, for example, ±30%, ±20%, ±15%, ±10%, ±5% of the stated value. Moreover, a relatively acceptable range of deviation or standard deviation may be chosen for the term "approximately" or "substantially" as used herein based on optical properties, etching properties or other properties, instead of applying one standard deviation across all the properties.

Unless otherwise defined, all terms (comprising technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
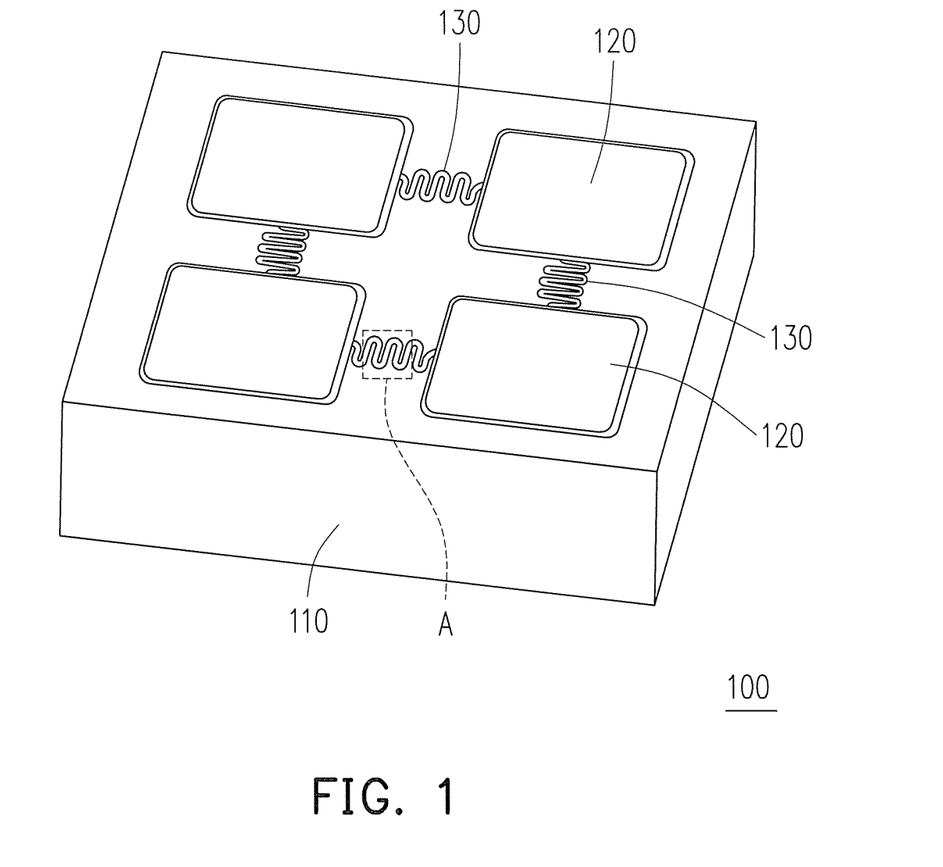
FIG. 1 is a schematic partial view of a stretchable electronic device according to an embodiment of the disclosure.

FIG. 1 is a schematic partial view of a stretchable electronic device according to an embodiment of the disclosure. With reference to FIG. 1, a stretchable electronic device 100 provided in the embodiment 100 includes a substrate 110, a plurality of electronic elements 120, and a conductive wiring 130. The electronic elements 120 and the conductive wiring 130 are disposed on the substrate 110, and the conductive wiring 130 is electrically connected to the electronic elements 120.

Figure 2A:
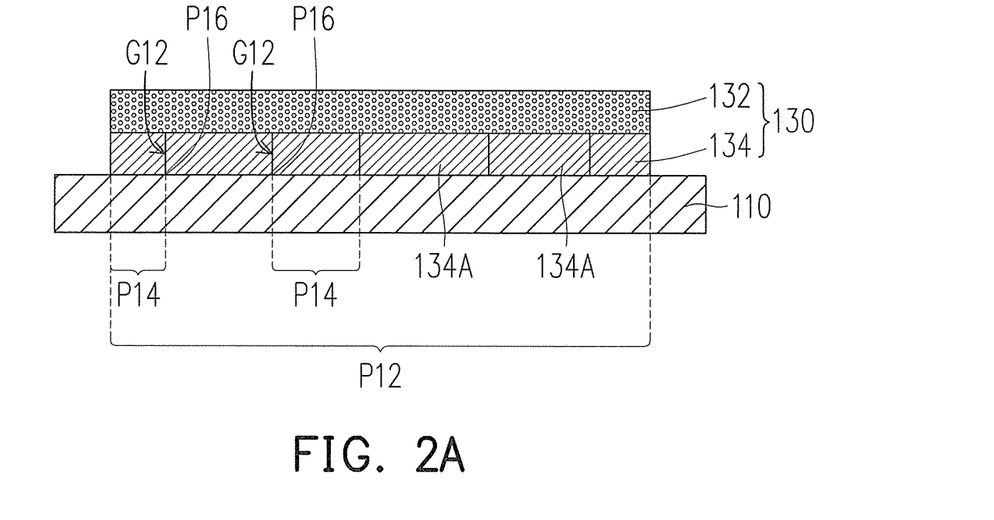
FIG. 2A and FIG. 2B are schematic cross-sectional views illustrating an extension direction of the conductive wiring depicted in FIG. 1 before and after being stretched, respectively.
Figure 2B:
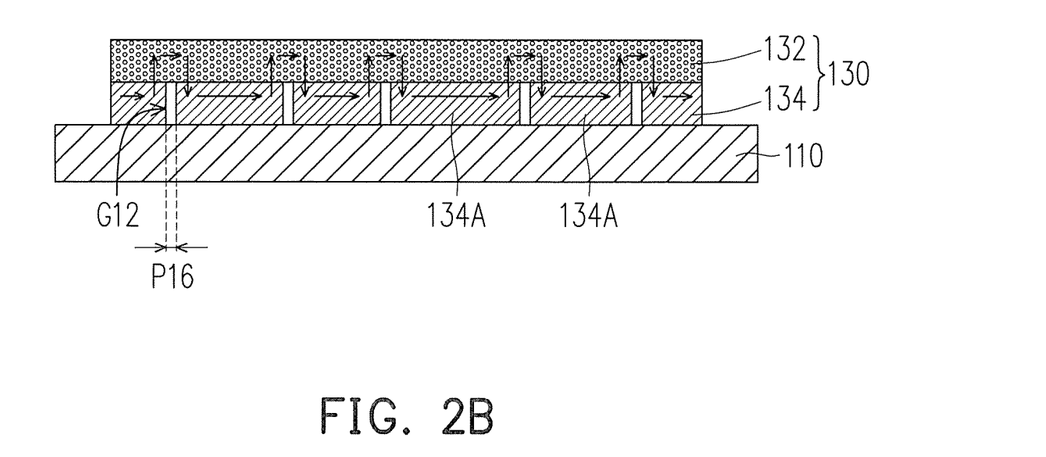

FIG. 2A and FIG. 2B are schematic cross-sectional views illustrating an extension direction of the conductive wiring depicted in FIG. 1 before and after being stretched, respectively. In order to highlight the stretching effect in the following embodiments depicted in the drawings, the variation amount of the stretching action is increased, which however does not represent the actual stretching ratio provided in each embodiment. With reference to FIG. 2A, the conductive wiring 130 is formed by stacking an elastic conductive layer 132 and a non-elastic conductive layer 134. A fracture strain of the elastic conductive layer 132 is greater than a fracture strain of the non-elastic conductive layer 134. That is, on the same conditions, the non-elastic conductive layer 134 subject to a tensile stress fractures earlier because the amount of strain reaches the amount of strain at fracture, and the elastic conductive layer 132 fractures later because of its larger fracture strain. The non-elastic conductive layer 134 includes a plurality of first fragments 134A separated from one another. Specifically, the first fragments 134A are disconnected from one another. However, the first fragments 134A may be in contact with one another, as shown in FIG. 2A.

The elastic conductive layer 132 is a continuous wiring. In other words, except for the endpoints of the conductive wiring 130, the conductive wiring 130 is not broken at any other location and is a continuous wiring. An orthogonal projection P12 of the elastic conductive layer 132 on the substrate 110 overlaps orthogonal projections P14 of all or a plurality of the first fragments 134A on the substrate 110, and the orthogonal projection P12 of the elastic conductive layer 132 on the substrate 110 overlaps orthogonal projections P16 of plurality of gaps G12 among the first fragments 134A on the substrate 110. In other words, the elastic conductive layer 132 is continuous and thus simultaneously corresponds to the first fragments 134A and the gaps G12 among the first fragments 134A. The orthogonal projections P16 of the gaps G12 on the substrate 110 as depicted in FIG. 2A appear to be dots, but the orthogonal projections P16 should be in a linear shape if they are observed from the top of the substrate 110.

On the other hand, on the route of the conductive wiring 130, the elastic conductive layer 132 along the route of the conductive wiring 130 is continuous and remains uninterrupted. Here, the continuation of the elastic conductive layer 132 indicates that the elastic conductive layer 132 remains unbroken in design, which does not rule out the condition that the elastic conductive layer 132 is broken due to poor manufacturing yield or other unexpected factors. In addition, when the conductive wiring 130 itself is divided into a plurality of fragments, the elastic conductive layer 132 is also divided into a plurality of fragments along with the conductive wiring 130, but the elastic conductive layer 132 remains unbroken on the single route of the conductive wiring 130. In the embodiment, the non-elastic conductive layer 134 is located between the substrate 110 and the elastic conductive layer 132, which should however not be construed as a limitation in the disclosure.

With reference to FIG. 2B, when the substrate 110 is stretched, the first fragments 134A of the non-elastic conductive layer 134 arranged on the substrate 110 are separated from one another. At the same time, the elastic conductive layer 132 stacked on the non-elastic conductive layer 134 is not broken because of its favorable elasticity. Therefore, the transmission path of electrical signals remains constant as shown by the arrows in FIG. 2B. Through the first fragments 134A, the electrical signals have low electrical resistance values at connected parts of the non-elastic conductive layer 134, and the electrical signals at disconnected parts of the non-elastic conductive layer 134 may be continuously transmitted through the elastic conductive layer 132.

It can be learned from the above that by stacking the elastic conductive layer 132 and the pre-disconnected non-elastic conductive layer 134, the conductive wiring 130 provided in the embodiment is not easily broken at the time of being stretched; meanwhile, the conductive wiring 130 may constantly has the low electrical resistance value. Therefore, the reliability and the performance of the stretchable electronic device 100 provided in the embodiment are improved.

In addition, since the substrate 110 is stretched, the orthogonal projections P16 of the gaps G12 on the substrate 110 as shown in FIG. 2B are stretched into a line and occupy a certain area if the orthogonal projections P16 are observed from the top of the substrate 110.

With reference to FIG. 1, the conductive wiring 130 provided in the embodiment appears to be in form of a curve, which may further reduce the possibility of being broken when the conductive wiring 130 is stretched. In addition, the electronic elements 120 provided in the embodiment are a plurality of display elements. For instance, each electronic element 120 may be a light-emitting diode (LED) element and is formed on a rigid substrate, so that the electronic elements 120 may be protected from being damaged when the stretchable electronic device 100 is stretched, and the electrical connections among the electronic elements 120 may be kept by the conductive wiring 130. In addition, a Young's modulus of the substrate 110 provided in the embodiment is less than 10 GPa, for instance, which should however not be construed as a limitation in the disclosure.

With reference to FIG. 2B, for instance, the fracture strain of the elastic conductive layer 132 is greater than 10%. In other words, for instance, when the stretched and elongated portion of the elastic conductive layer 132 becomes longer than 10% of the original length, the elastic conductive layer 132 may be broken. By contrast, the fracture strain of the non-elastic conductive layer 134 is, for instance, less than 10%. That is, for instance, even when the stretched and elongated portion of the non-elastic conductive layer 134 is less than 10% of the original length, the non-elastic conductive layer 134 may be broken. A material of the elastic conductive layer 132 may be a conductive polymer, including but not limited to polyacetylene, polypyrrole, polythiophene, polyaniline, poly(p-phenylene), poly(p-phenylene vinylene), or a combination thereof Alternatively, the elastic conductive layer 132 may include a polymer material and conductive particles mixed therein, and the conductive particles include, for instance, silver nanowires or carbon nanotubes. A material of the non-elastic conductive layer 134 is, for instance, selected from the group consisting of titanium, aluminum, molybdenum, copper, silver, and indium tin oxide.

Figure 3A:
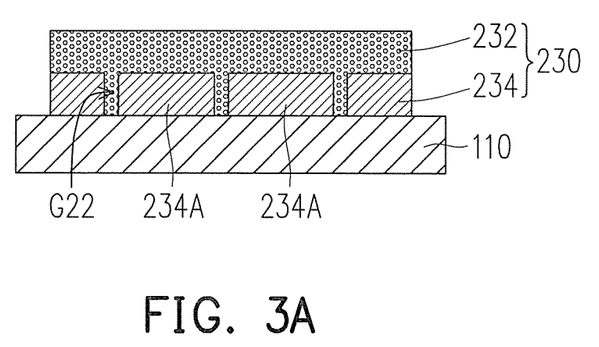
FIG. 3A and FIG. 3B are schematic cross-sectional views illustrating an extension direction of a conductive wiring provided in another embodiment before and after the conductive wiring is stretched, respectively.
Figure 3B:
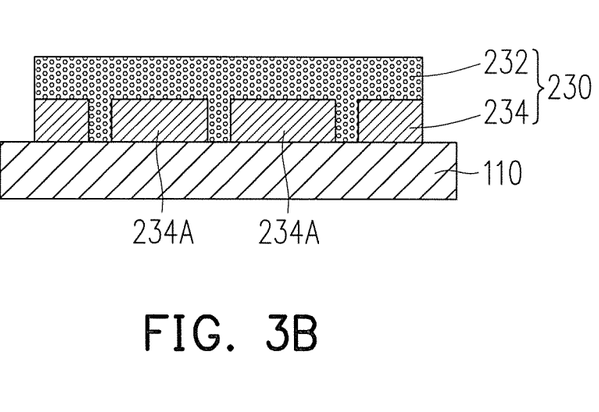
Figure 3C:
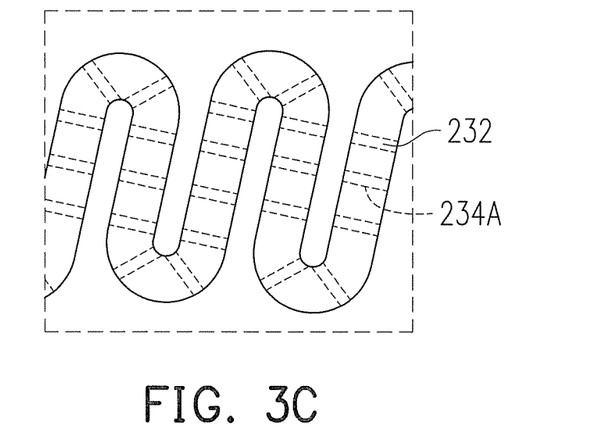
FIG. 3C is an enlarged view of region A indicated in FIG. 1.

FIG. 3A and FIG. 3B are schematic cross-sectional views illustrating an extension direction of a conductive wiring provided in another embodiment before and after the conductive wiring is stretched, respectively. The embodiment depicted in FIG. 3A and FIG. 3B is similar to the embodiment depicted in FIG. 2A and FIG. 2B; therefore, only the difference therebetween is described hereinafter, while the similarities will not be further explained. In this embodiment, the non-elastic conductive layer 234 includes a plurality of first fragments 234A that are separated from one another. Moreover, when the substrate 110 is not stretched, the first fragments 234A are separated from one another. Therefore, when the substrate 110 is compressed, the entire conductive wiring 230 may also be compressible. Optionally, the gaps G22 among the first fragments 234A may be filled with the elastic conductive layer 232, which should however not be construed as a limitation in the disclosure. Thereby, the conductive wiring 230 may have the improved stretchability.

Figure 4A:
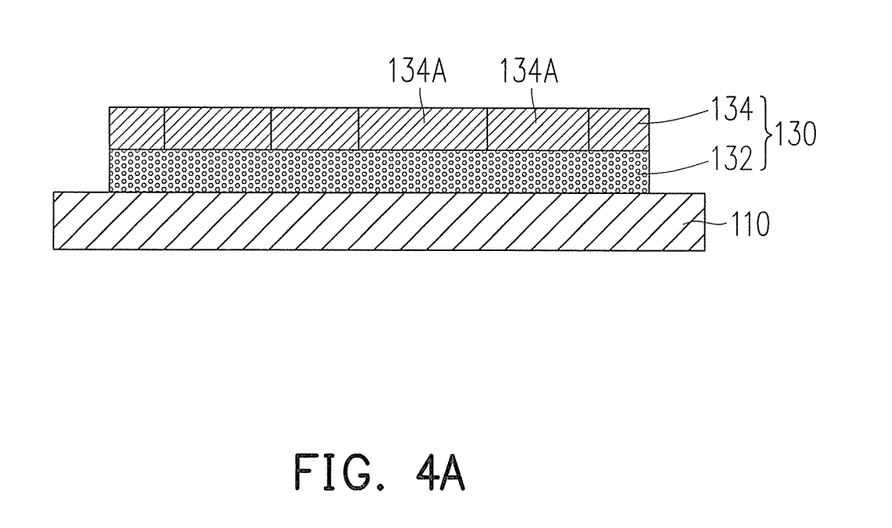
FIG. 4A and FIG. 4B are schematic cross-sectional views illustrating an extension direction of a conductive wiring provided in still another embodiment before and after the conductive wiring is stretched, respectively.
Figure 4B:
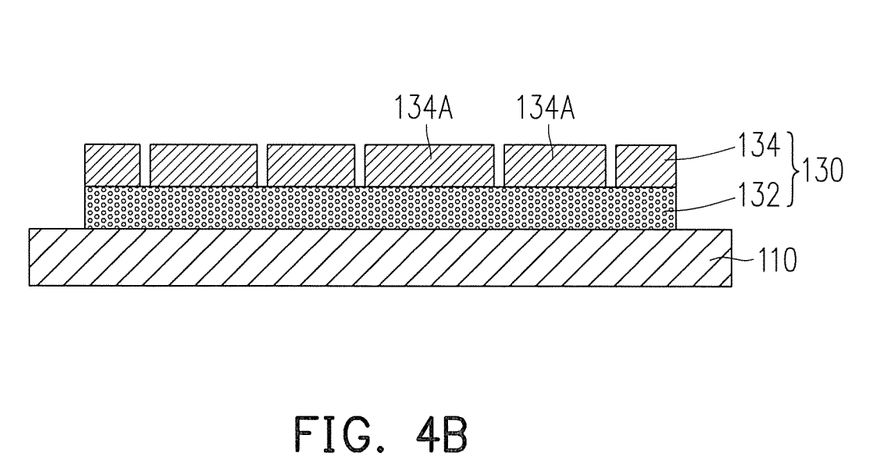

FIG. 4A and FIG. 4B are schematic cross-sectional views illustrating an extension direction of a conductive wiring provided in still another embodiment before and after the conductive wiring is stretched, respectively. The embodiment depicted in FIG. 4A and FIG. 4B is similar to the embodiment depicted in FIG. 2A and FIG. 2B; therefore, only the difference therebetween is described hereinafter, while the similarities will not be further explained. In this embodiment, the elastic conductive layer 132 is located between the substrate 110 and the non-elastic conductive layer 134. When the substrate 110 is stretched, the elastic conductive layer 132 disposed on the substrate 110 does not break because of its favorable elasticity. At the same time, the first fragments 134A of the non-elastic conductive layer 134 stacked on the elastic conductive layer 132 are separated from one another.

Figure 5A:
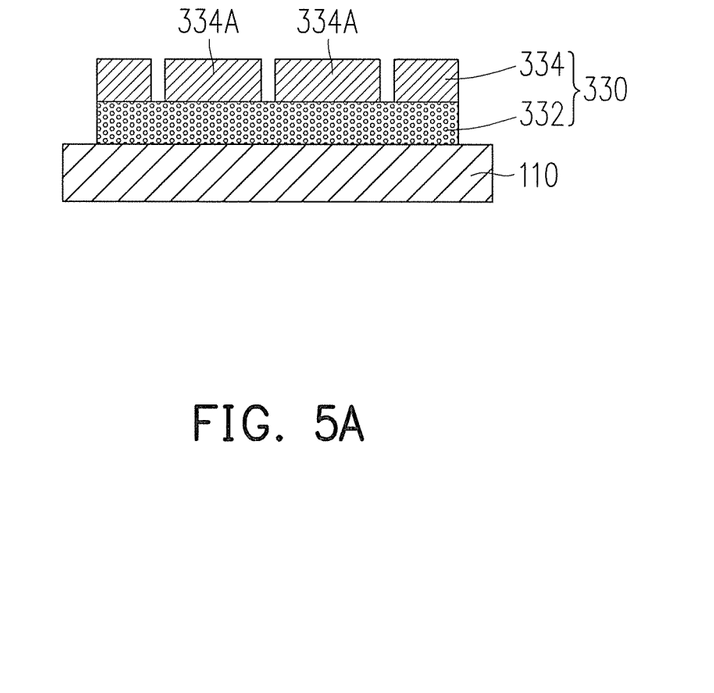
FIG. 5A and FIG. 5B are schematic cross-sectional views illustrating an extension direction of a conductive wiring provided in still another embodiment before and after the conductive wiring is stretched, respectively.
Figure 5B:
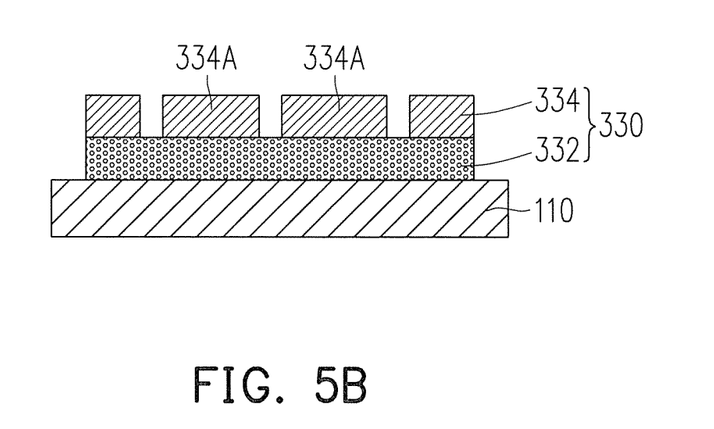

FIG. 5A and FIG. 5B are schematic cross-sectional views illustrating an extension direction of a conductive wiring provided in still another embodiment before and after the conductive wiring is stretched, respectively. The embodiment depicted in FIG. 5A and FIG. 5B is similar to the embodiment depicted in FIG. 4A and FIG. 4B; therefore, only the difference therebetween is described hereinafter, while the similarities will not be further explained. In this embodiment, the non-elastic conductive layer 334 includes a plurality of first fragments 334A which are separated from one another. Moreover, when the substrate 110 is not stretched, the first fragments 334A are separated from one another. Therefore, when the substrate 110 is compressed, the entire conductive wiring 330 may also be compressible.

Figure 6A:
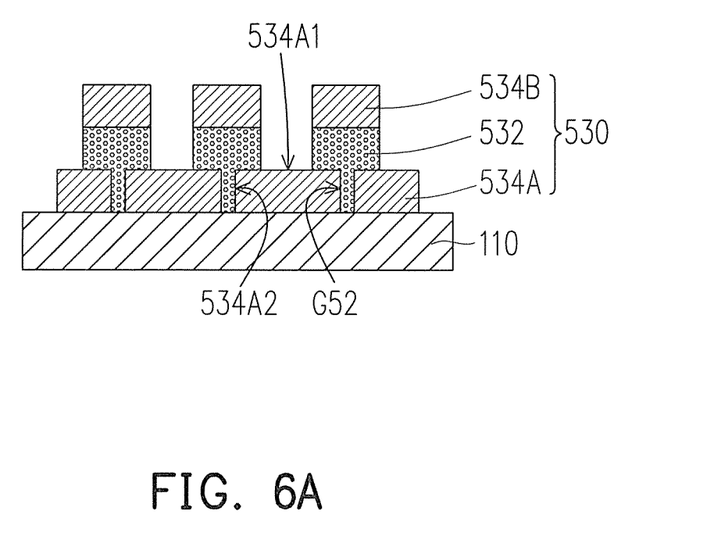
FIG. 6A and FIG. 6B are schematic cross-sectional views illustrating an extension direction of a conductive wiring provided in another embodiment before and after the conductive wiring is stretched, respectively.
Figure 6B:
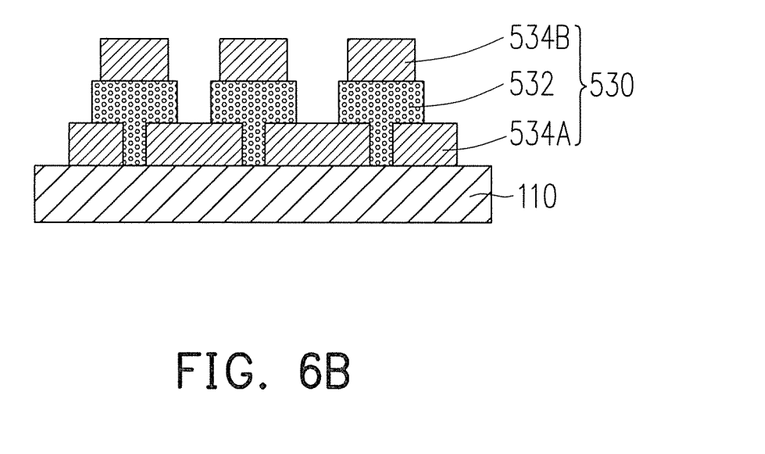

FIG. 6A and FIG. 6B are schematic cross-sectional views illustrating an extension direction of a conductive wiring provided in another embodiment before and after the conductive wiring is stretched, respectively. The embodiment depicted in FIG. 6A and FIG. 6B is similar to the embodiment depicted in FIG. 3A and FIG. 3B; therefore, only the difference therebetween is described hereinafter, while the similarities will not be further explained. In this embodiment, there are a first non-elastic conductive layer 534A and a second non-elastic conductive layer 534B, and one elastic conductive layer 532 is located between the first non-elastic conductive layer 534A and the second non-elastic conductive layer 534B. Thereby, the conductive wiring 530 may have the improved reliability. In addition, the elastic conductive layer 532 includes a plurality of fragments which are separated from one another, whereby the amount of the material used by the elastic conductive layer 532 may be reduced, thus reducing the cost of the conductive wiring 530. Optionally, the gaps G52 among the fragments of the first non-elastic conductive layer 534A may be filled with the elastic conductive layer 532, which should however not be construed as a limitation in the disclosure. In this embodiment, one part of an upper surface 534A1 of the first non-elastic conductive layer 534A located at a lower side is not covered by the elastic conductive layer 532, and the other part of the upper surface 534A1 and a side surface 531A2 of the first non-elastic conductive layer 534A are covered by the elastic conductive layer 532.

Figure 7A:
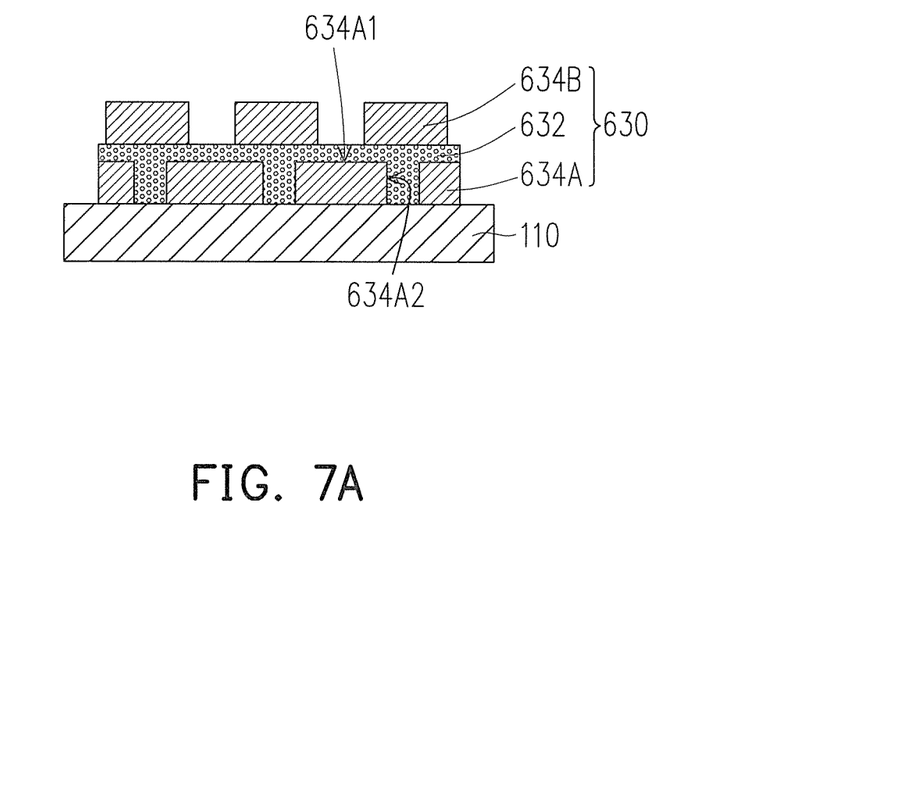
FIG. 7A and FIG. 7B are schematic cross-sectional views illustrating an extension direction of a conductive wiring provided in another embodiment before and after the conductive wiring is stretched, respectively.
Figure 7B:
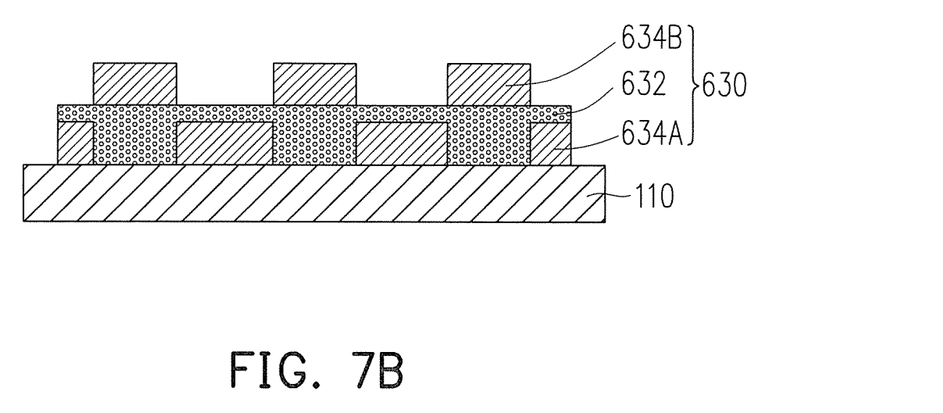

FIG. 7A and FIG. 7B are schematic cross-sectional views illustrating an extension direction of a conductive wiring provided in another embodiment before and after the conductive wiring is stretched, respectively. The embodiment depicted in FIG. 7A and FIG. 7B is similar to the embodiment depicted in FIG. 3A and FIG. 3B; therefore, only the difference therebetween is described hereinafter, while the similarities will not be further explained. In this embodiment, there are a first non-elastic conductive layer 634A and a second non-elastic conductive layer 634B, and one elastic conductive layer 632 is located between the first non-elastic conductive layer 634A and the second non-elastic conductive layer 634B. Thereby, the conductive wiring 630 may have the improved reliability. In this embodiment, an upper surface 634A1 and a side surface 634A2 of the first non-elastic conductive layer 634A located at a lower side are both covered by the elastic conductive layer 632.

Figure 8A:
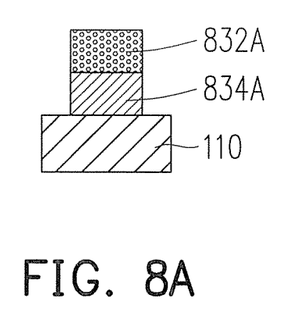
FIG. 8A to FIG. 8D are schematic cross-sectional views of a conductive wiring perpendicular to an extension direction of the conductive wiring according to four embodiments, respectively.
Figure 8B:
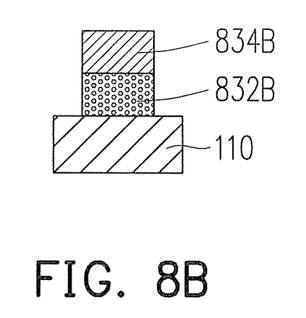
Figure 8C:
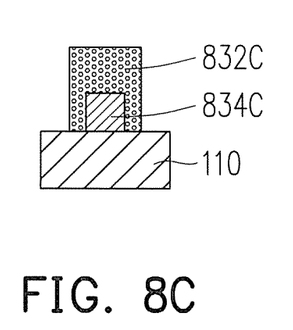
Figure 8D:
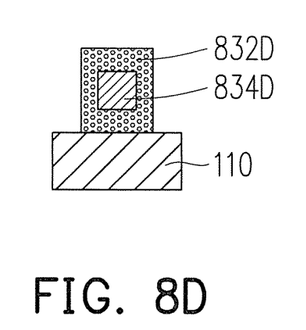

FIG. 8A to FIG. 8D are schematic cross-sectional views of a conductive wiring perpendicular to an extension direction of the conductive wiring according to four embodiments, respectively. With reference to FIG. 8A, in the embodiment, the non-elastic conductive layer 834A is located between the substrate 110 and the elastic conductive layer 832A, and only the non-elastic conductive layer 834A is in contact with the substrate 110. With reference to FIG. 8B, in the embodiment, the elastic conductive layer 832B is located between the substrate 110 and the non-elastic conductive layer 834B, and only the elastic conductive layer 832B is in contact with the substrate 110. With reference to FIG. 8C, in the embodiment, the elastic conductive layer 832C covers the non-elastic conductive layer 834C, and both the elastic conductive layer 832C and the non-elastic conductive layer 834C are in contact with the substrate 110. With reference to FIG. 8D, in the embodiment, the elastic conductive layer 832D covers the non-elastic conductive layer 834D, and only the elastic conductive layer 832D is in contact with the substrate 110. The above serves as an example of illustrating the cross-section of the conductive wiring perpendicular to the extension direction of the conductive wiring according to several embodiments of the disclosure, which should however not be construed as a limitation in the disclosure.

To sum up, in the stretchable electronic device provided in one or more embodiments of the disclosure, the conductive wiring is not easily broken, which is one of the characteristics of the elastic conductive layer, and has the low resistance value, which is one of the characteristics of the non-elastic conductive layer. As such, the performance and the reliability of the stretchable electronic device may be improved.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A stretchable electronic device, comprising:
   a substrate;
   a plurality of electronic elements, disposed on the substrate; and
   a conductive wiring, disposed on the substrate and electrically connected to the electronic elements, wherein the conductive wiring is formed by stacking an elastic conductive layer and a non-elastic conductive layer, a fracture strain of the elastic conductive layer is greater than a fracture strain of the non-elastic conductive layer, the non-elastic conductive layer comprises a plurality of first fragments separated from one another, the elastic conductive layer is a continuous wiring, and an orthogonal projection of the elastic conductive layer on the substrate overlaps orthogonal projections of a plurality of the first fragments and a plurality of gaps among the plurality of the first fragments on the substrate.

2. The stretchable electronic device according to claim 1, wherein the fracture strain of the elastic conductive layer is greater than 10%.

3. The stretchable electronic device according to claim 1, wherein the fracture strain of the non-elastic conductive layer is less than 10%.

4. The stretchable electronic device according to claim 1, wherein a material of the elastic conductive layer comprises at-least one of polyacetylene, polypyrrole, polythiophene, polyaniline, poly(p-phenylene), and poly(p-phenylene vinylene).

5. The stretchable electronic device according to claim 1, wherein when the substrate is not stretched, the first fragments are separated from one another.

6. The stretchable electronic device according to claim 1, wherein the non-elastic conductive layer is located between the substrate and the elastic conductive layer.

7. The stretchable electronic device according to claim 1, wherein both the non-elastic conductive layer and the elastic conductive layer are in contact with the substrate, and the elastic conductive layer covers the non-elastic conductive layer.

8. The stretchable electronic device according to claim 1, wherein the non-elastic conductive layer is in contact with the substrate, and the elastic conductive layer covers the non-elastic conductive layer.

9. The stretchable electronic device according to claim 1, wherein a Young's modulus of the substrate is less than 10 GPa.

10. The stretchable electronic device according to claim 1, wherein the electronic elements are a plurality of display elements.

11. The stretchable electronic device according to claim 1, wherein when the substrate is not stretched, the first fragments are in contact.

12. The stretchable electronic device according to claim 1, wherein the elastic conductive layer is located between the substrate and the non-elastic conductive layer.

* * * * *